(12) United States Patent
Hwang et al.

(10) Patent No.: US 10,355,645 B2
(45) Date of Patent: Jul. 16, 2019

(54) POWER AMPLIFIER

(71) Applicant: SAMSUNG ELECTRO-MECHANICS CO., LTD., Suwon-si (KR)

(72) Inventors: Hyeon Seok Hwang, Suwon-si (KR); Jong Soo Lee, Suwon-si (KR); Seung Chul Pyo, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 15/800,779

(22) Filed: Nov. 1, 2017

(65) Prior Publication Data

US 2018/0287561 A1 Oct. 4, 2018

(30) Foreign Application Priority Data

Mar. 29, 2017 (KR) .................. 10-2017-0039999

(51) Int. Cl.
| | |
|---|---|
| H03F 1/02 | (2006.01) |
| H03F 3/21 | (2006.01) |
| H03F 1/32 | (2006.01) |
| H03F 3/195 | (2006.01) |
| H03F 1/30 | (2006.01) |
| H03F 3/24 | (2006.01) |

(52) U.S. Cl.
CPC ......... *H03F 1/0205* (2013.01); *H03F 1/0261* (2013.01); *H03F 1/301* (2013.01); *H03F 1/3205* (2013.01); *H03F 3/195* (2013.01); *H03F 3/211* (2013.01); *H03F 3/245* (2013.01); *H03F 2200/18* (2013.01); *H03F 2200/243* (2013.01); *H03F 2200/366* (2013.01); *H03F 2200/447* (2013.01); *H03F 2200/451* (2013.01)

(58) Field of Classification Search
USPC ............... 330/295, 124 R, 84, 286, 285, 296
See application file for complete search history.

(56) References Cited

U.S. PATENT DOCUMENTS

| | | |
|---|---|---|
| 5,321,279 A | 6/1994 | Khatibzadeh et al. |
| 9,263,559 B2 | 2/2016 | Sasaki et al. |
| 9,660,589 B2 * | 5/2017 | Kondo .................. H03F 1/0222 |
| 9,667,206 B2 * | 5/2017 | Anderson ............... H03F 3/213 |
| 2006/0267684 A1 | 11/2006 | Ohnishi et al. |
| 2016/0276980 A1 | 9/2016 | Nam et al. |

FOREIGN PATENT DOCUMENTS

| | | |
|---|---|---|
| JP | 2006-333060 A | 12/2006 |
| KR | 10-2016-0112156 A | 9/2016 |

OTHER PUBLICATIONS

Gao, H. et al., "Novel Ballast Resistor Network for Power Amplifier Design," IEEE, California, Mar. 18, 2007 (3 pages in English).

* cited by examiner

*Primary Examiner* — Hieu P Nguyen
(74) *Attorney, Agent, or Firm* — NSIP Law

(57) ABSTRACT

A power amplifier includes an amplifying circuit configured to amplify an input signal and comprising transistors, which may be disposed in parallel with one another and divided into a first group of transistors and a second group of transistors. The power amplifier also includes a bias circuit configured to supply bias power to one of the transistors of the first group and the transistors of the second group.

16 Claims, 6 Drawing Sheets

POWER AMPLIFIER

CROSS-REFERENCE TO RELATED APPLICATION(S)

This application claims benefit under 35 USC 119(a) of Korean Patent Application No. 10-2017-0039999 filed on Mar. 29, 2017 in the Korean Intellectual Property Office, the entire disclosure of which is incorporated herein by reference for all purposes.

BACKGROUND

1. Field

The following description relates to a power amplifier in a wireless communications device.

2. Description of Related Art

A wireless communications device, such as a mobile terminal, performs wireless communications using a power amplifier.

The power amplifier amplifies input signals by transistors connected to each other in order to provide a high output. In addition, to improve efficiency of consumed power of the power amplifier, the power amplifier is operated in a low power mode in which bias power is supplied to some of the transistors.

However, in the low power mode as described above, the transistors have an asymmetrical structure in an overall arrangement of the power amplifier, such that thermal imbalance may occur and non-linearity of output signals may be caused.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

An example provides a power amplifier in which thermal imbalance is resolved and non-linearity of output signals is improved.

In accordance with an embodiment, there is provided a power amplifier, including: an amplifying circuit configured to amplify an input signal and comprising transistors, which may be disposed in parallel with one another and divided into a first group of transistors and a second group of transistors; and a bias circuit configured to supply bias power to one of the transistors of the first group and the transistors of the second group.

The bias circuit may further include: a first bias circuit configured to supply the bias power to the transistors of the first group; and a second bias circuit configured to supply the bias power to the transistors of the second group.

The first bias circuit may supply the bias power to the transistors of the first group except upon the second bias circuit supplying the bias power to the transistors of the second group.

A number of the transistors of the first group and a number of the transistors of the second group may be alternately disposed.

Each of the transistors may be a heterojunction bipolar transistor configured to amplify the input signal being input to a base terminal thereof and output the amplified signal through a collector terminal thereof.

Emitter terminals of the transistors may be connected to a ground through emitter lines.

The power amplifier may also include: an input terminal; and an output terminal, wherein the transistors may be disposed between the input terminal and the output terminal.

Base terminals of the transistors may be connected to the input terminal through respective coupling capacitors, and collector terminals of the transistors may be connected to the output terminal.

The power amplifier may be operated in a low power mode in which the bias power may be selectively supplied to the transistors of one of the first group and the second group.

The transistors may receive the bias power through respective ballast resistors connected to base terminals thereof.

The first bias circuit and the second bias circuit may be disposed in positions symmetrical to each other in relation to the transistors.

In accordance with an embodiment, there is provided a power amplifier, including: first transistors configured to receive bias power through first bias wirings; and second transistors configured to receive bias power through second bias wirings, wherein the first transistors and the second transistors may be disposed in parallel with one another, between an input terminal and an output terminal, and may be alternately disposed.

Each of the transistors may be a heterojunction bipolar transistor configured to amplify an input signal being input to a base terminal thereof and output the amplified signal through a collector terminal thereof.

Emitter terminals of the transistors may be connected to a ground through emitter lines.

The power amplifier may be operated in a low power mode in which the bias power may be selectively supplied to one of the first transistors and the second transistors.

The transistors receive the bias power through respective ballast resistors connected to base terminals thereof.

The first transistors and the second transistors may be alternately disposed to form a symmetrical array therebetween.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
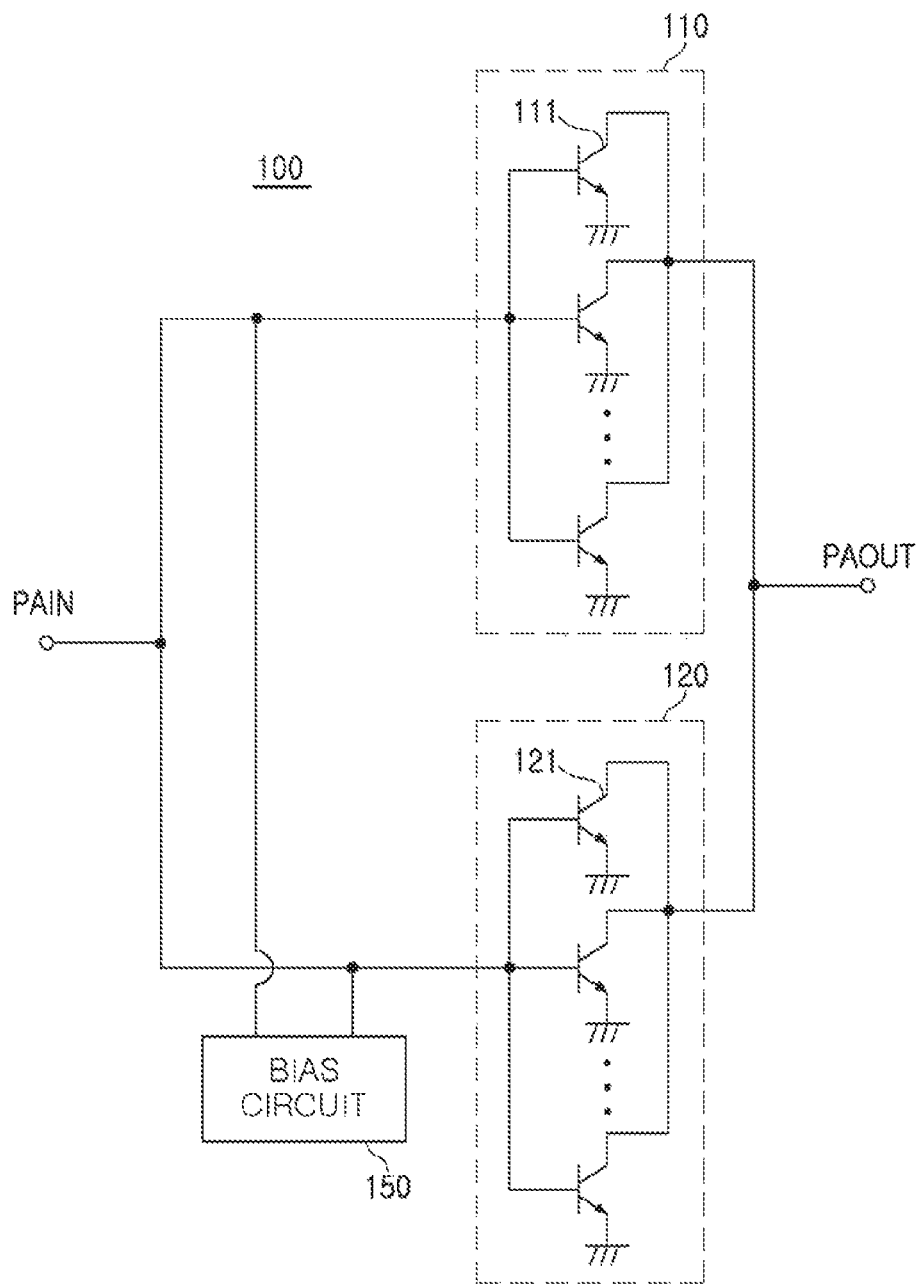
FIG. 1 is a schematic circuit diagram illustrating a power amplifier, according to an embodiment.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

FIG. 1 is a schematic circuit diagram illustrating a power amplifier, according to an embodiment.

Referring to FIG. 1, the power amplifier 100 includes a first amplifier 110 and a second amplifier 120 disposed between an input terminal PAIN and an output terminal PAOUT. In addition, the first amplifier 110 of the power amplifier 100 includes a plurality of first transistors 111, and the second amplifier 120 of the power amplifier 100 includes a plurality of second transistors 121. A bias circuit 150 supplies bias power to the first transistors 111 and to the second transistors 121.

Figure 2:
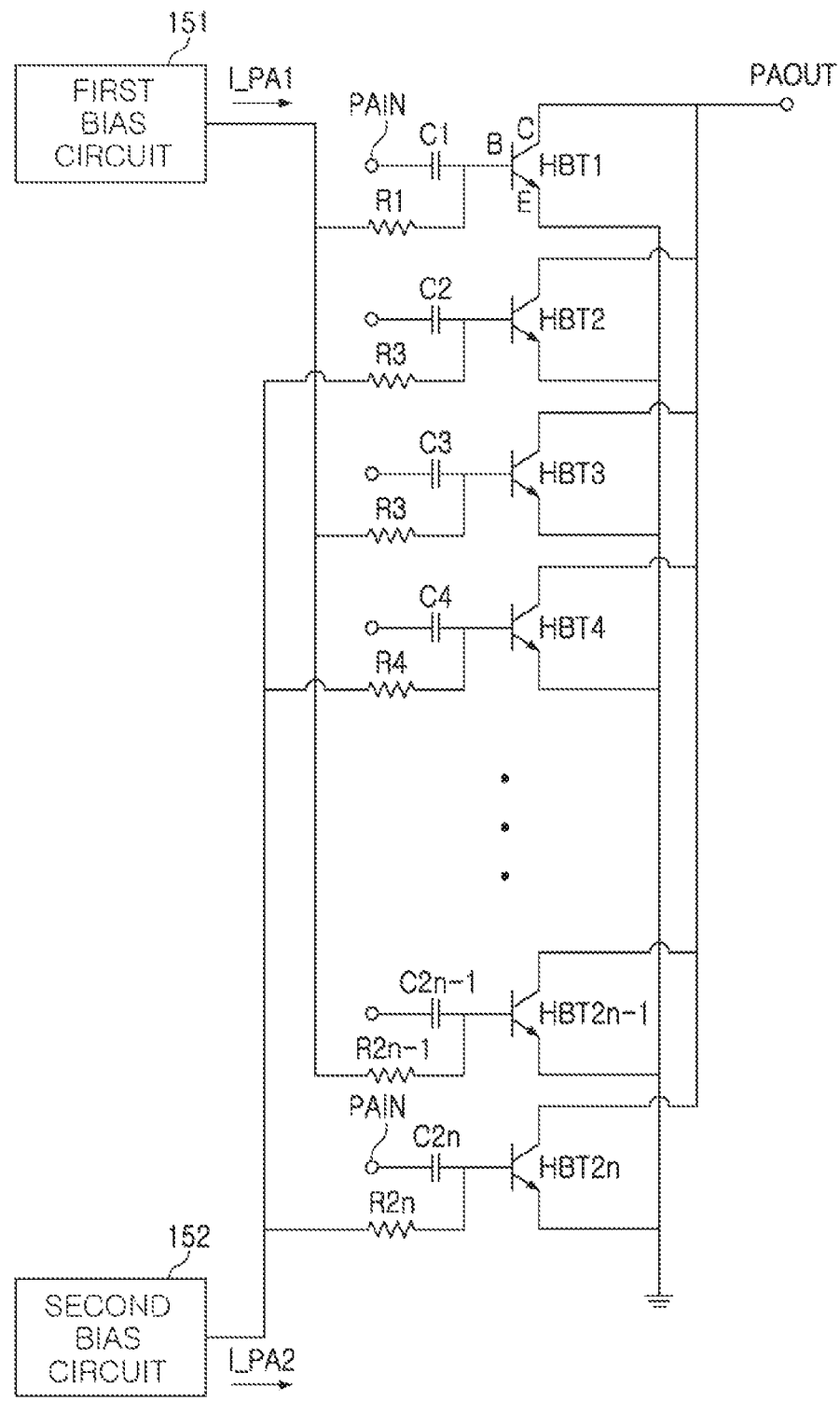
FIG. 2 is a circuit diagram illustrating a power amplifier, according to an embodiment.

FIG. 2 is a circuit diagram illustrating a power amplifier according to an embodiment in the present disclosure.

Referring to FIG. 2, the power amplifier according to the embodiment in the present disclosure may include a plurality of transistors HBT1 to HBT2N, a first bias circuit 151, and a second bias circuit 152.

The first bias circuit 151 supplies bias power to the first transistors 111, and the second bias circuit 152 supplies bias power to the plurality of second transistors 121. A number of transistors provided is in a factor of 2N or 2N+1, but in an embodiment, the number of transistors provided is in a factor of 2N for convenience of explanation.

When the power amplifier 100 is operated in a low power mode, only the first or the second transistors 111, 121 of any one of the first amplifier 110 and the second amplifier 120 are turned on. In one example, the power amplifier 100 is operated in the low power mode in which the first bias circuit 151 supplies the bias power to the first transistors 111 and the second bias circuit 152 does not supply the bias power to the second transistors 121. As described above, when the respective amplifiers use separate bias circuits, an amount of current provided by the respective bias circuits is reduced.

In addition, each of the transistors may be one of a metal semiconductor field effect transistor (MESFET), a pseudomorphic high electron mobility transistor (HEMT), and a heterojunction bipolar transistor (HBT) formed on a compound semiconductor substrate formed of gallium arsenide (GaAS), indium phosphorus (InP), or the like. In an embodiment, each of the transistors is the HBT, as described by way of example. The transistors amplify input signals input to base terminals thereof and output the amplified signals through collector terminals thereof.

The transistors HBT1 to HBT2N are disposed in parallel with one another between an input terminal PAIN and an output terminal PAOUT. Base terminals B of the respective transistors are connected to the input terminal PAIN through coupling capacitors C1 to C2N, respectively, and collector terminals C of the respective transistors are connected to the output terminal PAOUT. In addition, emitter terminals E of the transistors are connected to a ground.

In addition, the transistors HBT1 to HBT2N receive bias power through ballast resistors R1 to R2N connected to the base terminals thereof, respectively.

The ballast resistors R1 to R2N block influences generated by base-emitter voltages of the transistors HBT1 to HBT2N. That is, in a power amplifier in which the ballast resistors R1 to R2N are not provided or excluded, variations in base currents occur by the base-emitter voltages of the transistors. The variations in the base currents cause current collapse and thermal runaway due to current and thermal imbalance between the transistors HBT1 to HBT2. The ballast resistors R1 to R2N prevent the current collapse and the thermal runaway due to the variations in the base currents by blocking such variations in the base currents and improving amplification characteristics and reliability of the power amplifier 100.

In addition, the transistors HBT1 to HBT2N may be divided into different groups of transistors and then receive the bias power. Therefore, the transistors included in each of the groups may be individually turned on/off depending on the supply of the bias power.

For example, a first group includes odd-numbered transistors HBT1, HBT3 . . . HBT2N-1 of the transistors, and a second group includes even-numbered transistors HBT2, HBT4, . . . , HBT2N of the transistors. In addition, the bias power is selectively supplied to the transistors of one of the first group and the second group. That is, when the power amplifier is operated in the low power mode, only the transistors included in one of the first group and the second group are operated to amplify the input signals input to the base terminals thereof and output the amplified signals through the collector terminals thereof, resulting in improvement of efficiency of power consumption.

In addition, the transistors of the first group receive first bias power I_PA1 from the first bias circuit 151, and the transistors of the second group receive second bias power I_PA2 from the second bias circuit 152.

In addition, a predetermined number of the transistors of the first group and a predetermined number of the transistors of the second group are alternately disposed, arranged, or configured, individually or as a group. For example, as illustrated in FIG. 2, the odd-numbered transistors HBT1, HBT3, . . . , HBT2N-1 of the first group and the even-numbered transistors HBT2, HBT4, . . . , HBT2N of the second group are alternately disposed one by one. That is, the transistors of the first group connected to first bias wirings and the transistors of the second group connected to second bias wirings have a symmetrical structure therebetween.

Such a symmetrical structure resolves thermal imbalance and improves non-linearity of output signals in the low power mode in which only the transistors included in one of the first group and the second group amplify the input signals and output the amplified signals through the collector terminals thereof.

Figure 3:
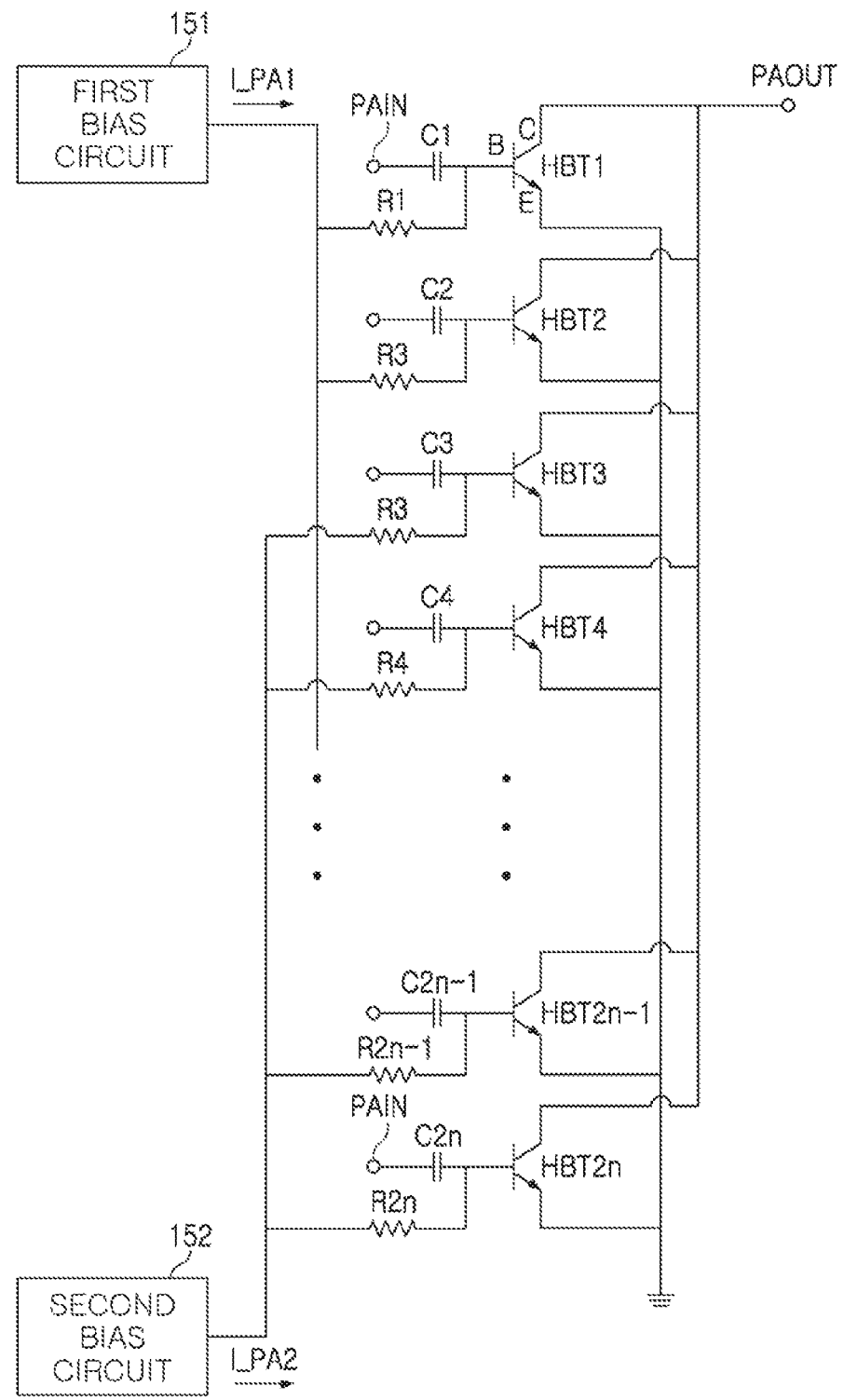
FIG. 3 is a circuit diagram illustrating a power amplifier, according an embodiment.

Furthermore, the number of each of transistors of the first group and transistors of the second group that are alternately disposed may be one or more. In FIG. 3, an embodiment in which transistors of a first group connected to first bias wirings and transistors of a second group connected to second bias wirings are alternately disposed in a two by two configuration is provided.

In FIG. 3, the transistors of the first group and the transistors of the second group are alternately disposed in such a way in which the two transistors of the first group receiving bias power from a first bias circuit are disposed side by side and the two transistors of the second group receiving bias power from a second bias circuit are disposed side by side, adjacently to the two transistors of the first group.

Figure 4:
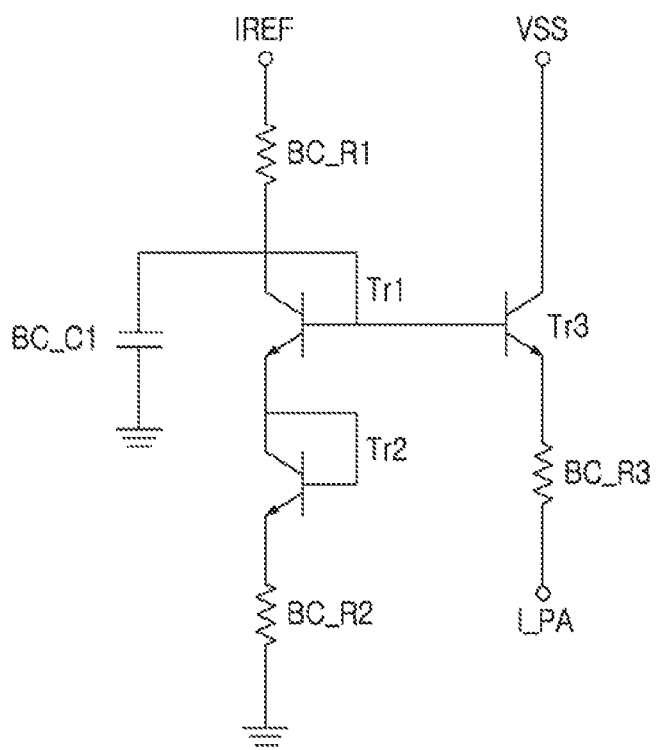
FIG. 4 is a circuit diagram illustrating a bias circuit, according to an embodiment.

FIG. 4 is a circuit diagram illustrating a bias circuit, according to an embodiment.

The bias circuit illustrated in FIG. 4, which is an example of the first bias circuit 151 (see FIG. 2) and the second bias circuit 152 (see FIG. 2) described above, may be modified into various power supply circuits having the same function.

Referring to FIG. 4, the bias circuit includes a first transistor Tr1, a second transistor Tr2, and a third transistor Tr3. In addition, each of the first to third transistors Tr1 to Tr3 may be one of a metal semiconductor field effect transistor (MESFET), a pseudomorphic high electron mobility transistor (HEMT), and a heterojunction bipolar transistor (HBT) formed on a compound semiconductor substrate formed of gallium arsenide (GaAS), indium phosphorus (InP), or the like.

The first transistor Tr1 and the second transistor Tr2 provide a control signal generated by converting power input from a reference power supply IREF to a base terminal of the third transistor Tr3. In an example, the control signal is set by resistance values of a first resistor BC_R1 and a second resistor BC_R2. A first capacitor BC_C1 is a bypass capacitor.

In addition, the third transistor Tr3 receives supplied power VSS at a collector terminal thereof, and supplies bias power I_PA based on the control signal.

Figure 5:
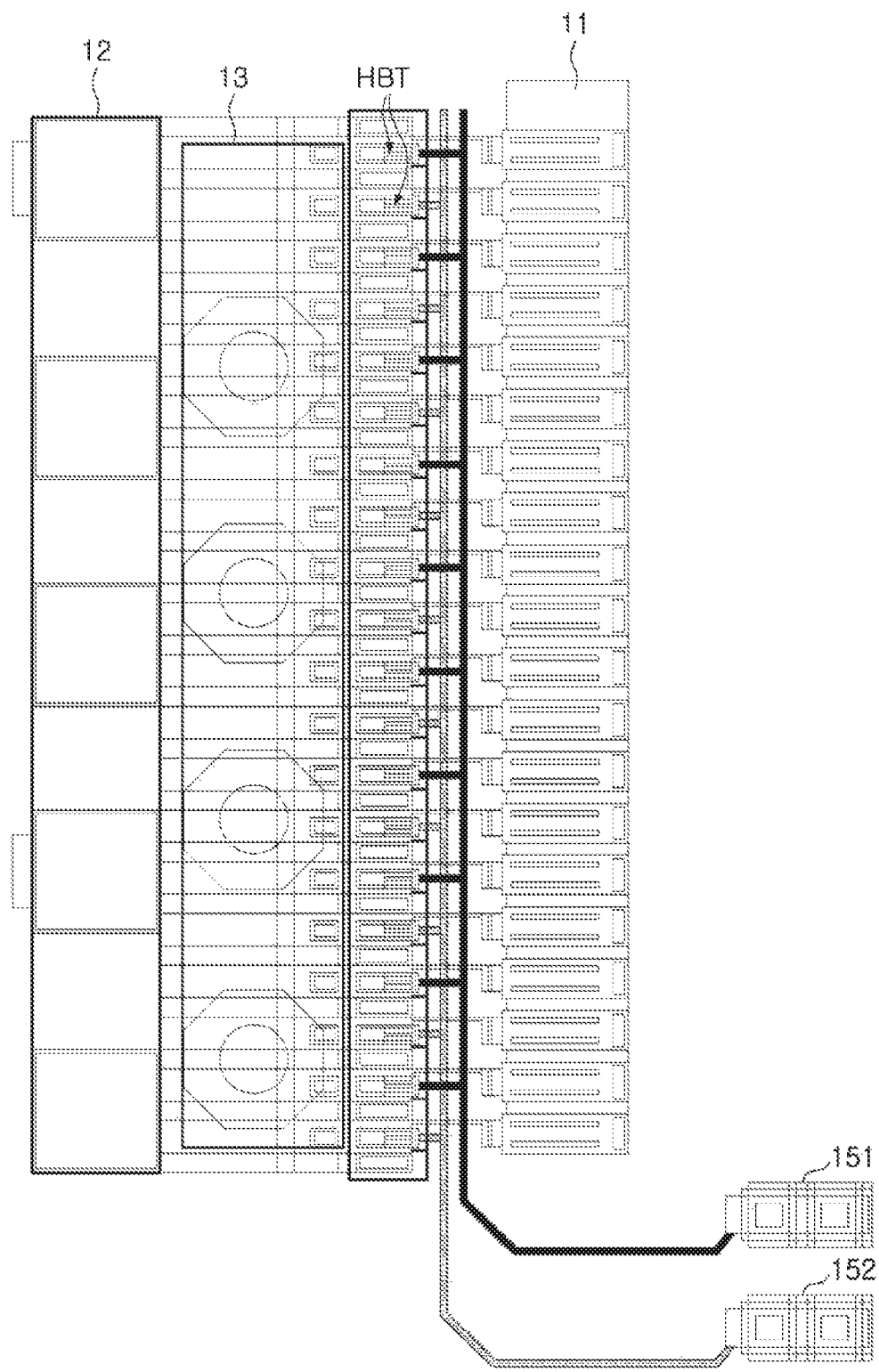
FIG. 5 is a view illustrating a layout of the power amplifier, according to an embodiment.
Figure 6:
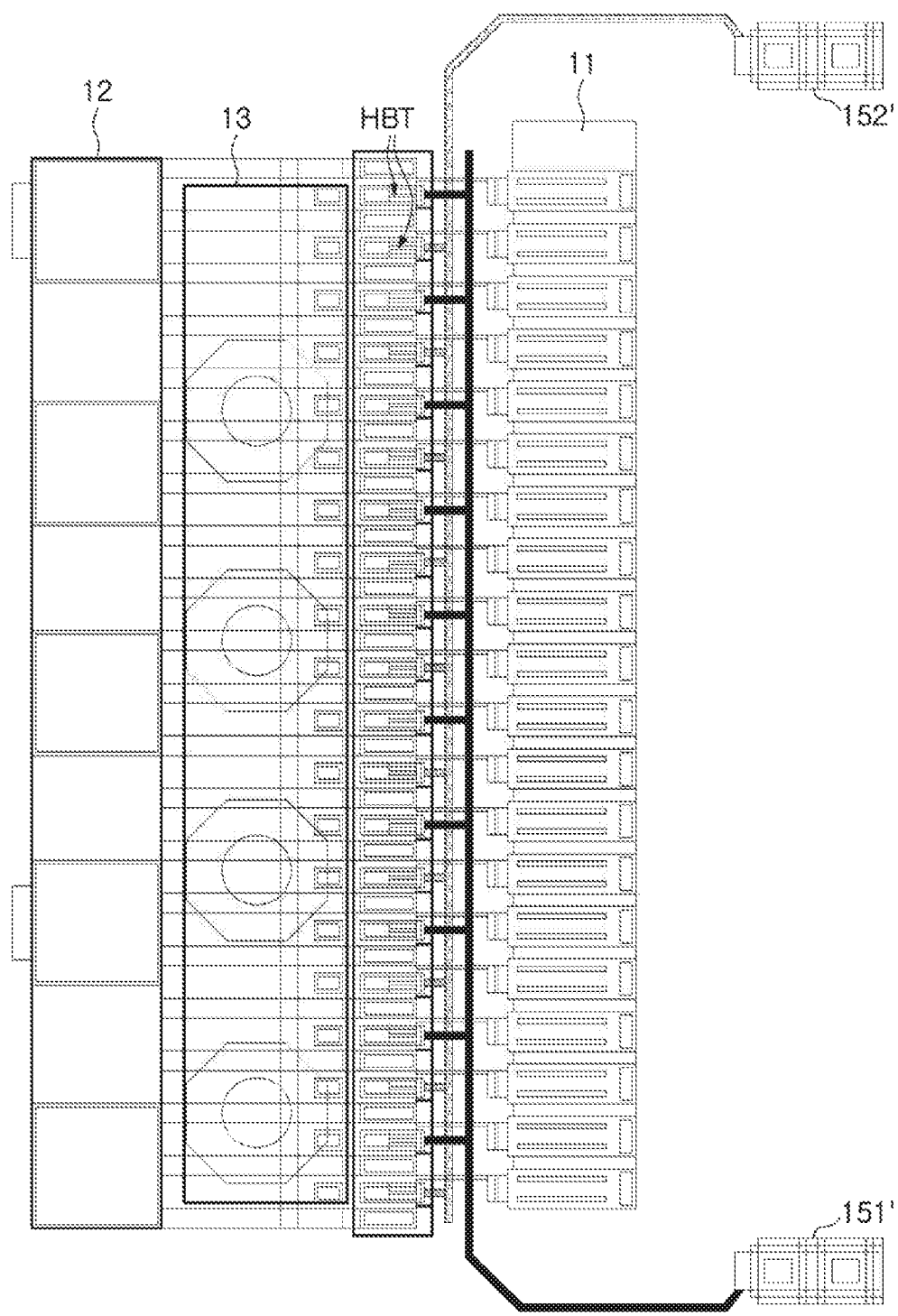
FIG. 6 is a view illustrating a layout of the power amplifier, according to an embodiment.

FIG. 5 is a view illustrating a layout of the power amplifier, according to an embodiment. FIG. 6 is a view illustrating a layout of the power amplifier, according to an embodiment.

As illustrated in FIGS. 5 and 6, transistors HBTs are arranged or configured to be in parallel with one another on a semiconductor substrate.

Base terminals of the transistors HBTs receive input signals through base lines 12, and collector terminals of the transistors HBTs output amplified signals generated by amplifying the input signals, through collector lines 11. In addition, emitter terminals of the transistors HBTs are connected to a ground through emitter lines 13.

Referring to FIG. 5, the transistors HBTs receive bias power from a first bias circuit 151 and a second bias circuit 152. Transistors receiving the bias power through first bias wirings connected to the first bias circuit 151 are referred to as first transistors, and transistors receiving the bias power through second bias wirings connected to the second bias circuit 152 are referred to as second transistors. In the layout of the power amplifier illustrated in FIG. 5, first transistors and second transistors are alternately disposed. Therefore, the first transistors and the second transistors form a symmetrical array therebetween. Such a symmetrical array resolves thermal imbalance that is generated in the power amplifier, and improves non-linearity of output signals.

In addition, referring to FIG. 6, a first bias circuit 151' and a second bias circuit 152' are disposed at positions symmetrical to each other in relation to the transistors HBTs arranged in parallel with one another. Because the first bias circuit 151' and the second bias circuit 152' are disposed at the positions symmetrical to each other, the non-linearity of the power amplifier is further improved.

As set forth above, in the power amplifier, according to an embodiment, bias circuits for transistors operated when the power amplifier is driven in the low power mode are separately used to reduce a current flowing to bias wirings in the low power mode.

In addition, the transistors connected to the first bias wirings and the transistors connected to the second bias wirings have a symmetrical structure therebetween to solve the thermal imbalance and improve the non-linearity of the output signals.

As a non-exhaustive example only, a wireless communication device as described herein may be a mobile device, such as a cellular phone, a smart phone, a wearable smart device (such as a ring, a watch, a pair of glasses, a bracelet, an ankle bracelet, a belt, a necklace, an earring, a headband, a helmet, or a device embedded in clothing), a portable personal computer (PC) (such as a laptop, a notebook, a subnotebook, a netbook, or an ultra-mobile PC (UMPC), a tablet PC (tablet), a phablet, a personal digital assistant (PDA), a digital camera, a portable game console, an MP3 player, a portable/personal multimedia player (PMP), a handheld e-book, a global positioning system (GPS) navigation device, or a sensor, or a stationary device, such as a desktop PC, a high-definition television (HDTV), a DVD player, a Blu-ray player, a set-top box, or a home appliance, or any other mobile or stationary device configured to perform wireless or network communication. In one example, a wearable device is a device that is designed to be mountable directly on the body of the user, such as a pair of glasses or a bracelet. In another example, a wearable device is any device that is mounted on the body of the user using an attaching device, such as a smart phone or a tablet attached to the arm of a user using an armband, or hung around the neck of the user using a lanyard.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A power amplifier comprising:
   an amplifying circuit configured to amplify an input signal and comprising transistors connected in parallel with one another and divided into a first group of transistors and a second group of transistors;
   a single first bias circuit configured to supply a first bias power to the transistors of the first group; and
   a single second bias circuit configured to supply a second bias power to the transistors of the second group,
   wherein the transistors of the first group and the transistors of the second group are alternately disposed at least two at a time, and
   the single first bias circuit and the single second bias circuit are symmetrically disposed with respect to the transistors of the first group and the transistors of the second group.

2. The power amplifier of claim 1, wherein the single first bias circuit is further configured to supply the first bias power to the transistors of the first group while the single second bias circuit is not supplying the second bias power to the transistors of the second group, and
   the single second bias circuit is further configured to supply the second bias power to the transistors of the second group while the single first bias circuit is not supplying the first bias power to the transistors of the first group.

3. The power amplifier of claim 1, wherein each of the transistors of the first group and the transistors of the second group is a heterojunction bipolar transistor comprising a base terminal and a collector terminal and configured to receive the input signal through the base terminal, amplify the input signal to produce an amplified signal, and output the amplified signal through the collector terminal.

4. The power amplifier of claim 1, further comprising emitter lines respectively corresponding to the transistors of the first group and the transistors of the second group and configured to be connected to a ground,
   wherein each of the transistors of the first group and the transistors of the second group comprises an emitter terminal connected to the ground through a respective one of the emitter lines.

5. The power amplifier of claim 1, further comprising:
   an input terminal; and
   an output terminal,
   wherein the transistors of the first group and the transistors of the second group are connected in parallel with one another between the input terminal and the output terminal.

6. The power amplifier of claim 5, further comprising coupling capacitors respectively corresponding to the transistors of the first group and the transistors of the second group,
   wherein each of the transistors of the first group and the transistors of the second group comprises a base terminal connected to the input terminal through a respective one of the coupling capacitors, and a collector terminal connected to the output terminal.

7. The power amplifier of claim 1, wherein the single first bias circuit and the single second bias circuit are further configured to operate in a low power mode in which the single first bias circuit supplies the first bias power to the transistors of the first group and the single second bias circuit does not supply the second bias power to the transistors of the second group, or the single second bias circuit supplies the second bias power to the transistors of the second group and the single first bias circuit does not supply the first bias power to the transistors of the first group.

8. The power amplifier of claim 1, further comprising ballast resistors respectively corresponding to the transistors of the first group and the transistors of the second group,
   wherein each of the transistors of the first group comprises a base terminal connected to the single first bias circuit through a respective one of the ballast resistors, and
   each of the transistors of the second group comprises a base terminal connected to the single second bias circuit through a respective one of the ballast resistors.

9. The power amplifier of claim 1, further comprising a semiconductor substrate,
   wherein the transistors of the first group and the transistors of the second group are alternately disposed at least two at a time on the semiconductor substrate in an array extending in a straight line in a first region of the semiconductor substrate, the first region being disposed between a first line extending perpendicularly to the straight line and tangent to a first end of the array, and a second line extending perpendicularly to the straight line and tangent to a second end of the array,
   the single first bias circuit is disposed on the semiconductor substrate in a second region of the semiconductor substrate, the second region being disposed on an opposite side of the first line from the first region, and
   the single second bias circuit is disposed on the semiconductor substrate in a third region of the semiconductor substrate, the third region being disposed on an opposite side of the second line from the first region.

10. A power amplifier comprising:
    an input terminal;
    an output terminal;

first bias wirings configured to be connected to a single first bias circuit configured to output a first bias power;
second bias wirings configured to be connected to a single second bias circuit configured to output a second bias power;
first transistors each configured to receive the first bias power from the single first bias circuit through the first bias wirings; and
second transistors each configured to receive the second bias power from the single second bias circuit through the second bias wirings,
wherein the first transistors and the second transistors are connected in parallel with one another between the input terminal and the output terminal, and are alternately disposed at least two at a time, and
the single first bias circuit and the single second bias circuit are symmetrically disposed with respect to the first transistors and the second transistors.

11. The power amplifier of claim 10, wherein each of the first transistors and the second transistors is a heterojunction bipolar transistor comprising a base terminal and a collector terminal and configured to receive an input signal through the base terminal, amplify the input signal to produce an amplified signal, and output the amplified signal through the collector terminal.

12. The power amplifier of claim 10, further comprising emitter lines respectively corresponding to the first transistors and the second transistors and configured to be connected to a ground,
wherein each of the first transistors and the second transistors comprises an emitter terminal connected to the ground through a respective one of the emitter lines.

13. The power amplifier of claim 10, wherein the single first bias circuit and the single second bias circuit are further configured to operate in a low power mode in which the single first bias circuit supplies the first bias power to the first transistors and the single second bias circuit does not supply the second bias power to the second transistors, or the single second bias circuit supplies the second bias power to the second transistors and the single first bias circuit does not supply the first bias power to the first transistors.

14. The power amplifier of claim 10, further comprising ballast resistors respectively corresponding to the first transistors and the second transistors,
wherein the each of the first transistors comprises a base terminal connected to the single first bias circuit through a respective one of the ballast resistors, and
each of the second transistors comprises a base terminal connected to the single second bias circuit through a respective one of the ballast resistors.

15. The power amplifier of claim 10, wherein the first transistors and the second transistors are alternately disposed at least two at a time to form an array in which the first transistors and the second transistors are symmetrically disposed relative to each other.

16. The power amplifier of claim 10, further comprising a semiconductor substrate,
wherein the first transistors and the second transistors are alternately disposed at least two at a time on the semiconductor substrate in an array extending in a straight line in a first region of the semiconductor substrate, the first region being disposed between a first line extending perpendicularly to the straight line and tangent to a first end of the array, and a second line extending perpendicularly to the straight line and tangent to a second end of the array,
the single first bias circuit is disposed on the semiconductor substrate in a second region of the semiconductor substrate, the second region being disposed on an opposite side of the first line from the first region,
the single second bias circuit is disposed on the semiconductor substrate in a third region of the semiconductor substrate, the third region being disposed on an opposite side of the second line from the first region,
the first bias wirings are disposed on the semiconductor substrate and the first bias circuit to each of the first transistors, and
the second bias wirings are disposed on the semiconductor substrate and connect the second bias circuit to each of the second transistors.

* * * * *